United States Patent
Wachtler (10) Patent No.: US 8,823,168 B2
(45) Date of Patent: Sep. 2, 2014

(54) DIE UNDERFILL STRUCTURE AND METHOD

(75) Inventor: Kurt Peter Wachtler, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/600,621

(22) Filed: Aug. 31, 2012

(65) Prior Publication Data

US 2014/0061896 A1 Mar. 6, 2014

(51) Int. Cl.
*H01L 23/498* (2006.01)
*H01L 21/56* (2006.01)

(52) U.S. Cl.
USPC ........... 257/737; 257/734; 257/778; 257/789; 257/E23.021

(58) Field of Classification Search
USPC ................... 257/734, 737, 778, 789, E23.021
See application file for complete search history.

(56) References Cited

U.S. PATENT DOCUMENTS

| | | | |
|---|---|---|---|
| 5,959,363 A * | 9/1999 | Yamada et al. | 257/787 |
| 2002/0000658 A1* | 1/2002 | Kuwabara et al. | 257/737 |
| 2002/0033525 A1* | 3/2002 | Ohuchi | 257/679 |
| 2002/0089067 A1* | 7/2002 | Crane et al. | 257/778 |
| 2006/0200985 A1* | 9/2006 | Workman et al. | 29/860 |
| 2008/0122118 A1* | 5/2008 | Basheer et al. | 257/778 |

* cited by examiner

*Primary Examiner* — Peniel M Gumedzoe
(74) *Attorney, Agent, or Firm* — Eugene C. Conser; Frederick J. Telecky, Jr.

(57) ABSTRACT

A method of attaching an IC wafer having a plurality of copper pillars ("CuP's") projecting from one face thereof to a substrate having a plurality of contact pads on one face thereof including applying a film having a substantial amount of filler particles therein to the one face of the wafer; applying an a-stage resin having substantially no filler particles therein to the one face of the substrate; and interfacing the film with the a-stage resin.

9 Claims, 7 Drawing Sheets

DIE UNDERFILL STRUCTURE AND METHOD

BACKGROUND

During the past decade flip chip technology has emerged as a popular alternative to wire bonding for interconnecting semiconductor devices such as integrated circuit (IC) dies and microelectromechanical systems (MEMS) to substrates such as printed circuit boards, other interconnect boards and other dies.

"Flip chip," is also known as "controlled collapse chip connection" or its acronym, "C4." With flip chip technology, solder balls/bumps are attached to electrical contact pads on one face of the die/chip. The dies are usually processed at the wafer level, i.e., while multiple identical dies are still part of a large "wafer." Solder balls are deposited on chip pads on the top side of the wafer. The wafer is sometimes "singulated" or "diced" (cut up into separate dies) at this point to provide a number of separate flip chip dies each having solder balls on the top face surface. The chips may then be "flipped" over to connect the solder balls to matching contact pads on the top surface of a substrate such as a printed circuit board on which the flip chip is mounted. Solder ball attachment is usually provided by reflow heating.

Sometimes the wafer is further processed after solder bumping and while still in wafer form to connect it to another large substrate, such as a second wafer, which may comprise for example another flip chip wafer or a wafer of another type of die. Regions on the first wafer corresponding to later formed dies are attached to corresponding areas on the second wafer. Thereafter individual die on die units or "flip chip assemblies" are singulated from the attached wafers. In this situation the other substrate usually has interconnect structure on the face thereof opposite the face that is connected to the flip chip die. This other side face may then be connected to another substrate such as a printed circuit board. As IC dies have become more complex, the number of solder bumps/balls on flip chips have increased dramatically. Whereas in the past the solder balls were usually provided by relatively large round solder balls attached to the chip contact pads, more recently copper pillars ("CuP's") have been used in place of the solder balls. A CuP is an elongated copper post member that is attached at one end to a contact pad on the die. The CuP extends outwardly from the die in a direction perpendicular to the face of the die. Each CuP has a bullet shaped solder piece attached to its distal end. The CuP's are soldered by this bullet shaped solder piece to corresponding contact pads on a substrate as by reflow heating. CuP's are capable of being positioned much more densely, i.e., at a "higher pitch," than conventional solder balls/bumps.

DETAILED DESCRIPTION

This application, in general, discloses a method of attaching an IC wafer 100 having a plurality of copper pillars ("CuP's) 114 projecting from one face 112 thereof to a substrate 130 having a plurality of contact pads 134 on one face 132 thereof. The method includes applying a film 124 having a substantial amount of filler particles 126 therein to the one face 112 of the wafer 130. The method also includes applying an a-stage resin 122 having substantially no filler particles therein to the one face 132 of the substrate 130 and interfacing the film 124 with the a-stage resin 122. This application also discloses, in general, an electrical device 170 with a substrate 130 having a first face 132 that has a plurality of contact pads. The device 170 also includes a die 110 having a first face 112 with a plurality of CuP's 114 extending from it. Each CuP 114 has a distal end with a solder tip 116 mounted thereon. Each solder tip 116 also has a distal end. A first c-stage resin layer 124 has a relatively larger amount of filler particles 126 therein. The first c-stage resin layer 124 has a first surface adhered to the first face 112 of the die 110 and has a second surface opposite the first surface. A second a-stage resin layer 122 has a relatively smaller amount, if any, of filler particles 126. The second c-stage resin layer 122 has a first surface adhered to the substrate 130 first face 132 and has a second surface opposite the first surface that is adhered to the second surface of the first c-stage resin layer 124. Having thus generally disclosed a wafer/substrate attachment method and a die assembly 170 that may be formed by using the method, the method and apparatus and variations thereof will now be described in detail.

The primary purpose of underfill that is used with flip chips is to securely physically attach the flip chips to the associated substrate. A die with CuP's is also physically and electrically connected to an associated substrate by solder joint connections between the CuP's and the contact pads of the substrate. Although the attachment of flip chips having CuP's is described in detail herein, it will be understood by those skilled in the art that flip chips having solder balls/bumps rather than CuP's may be attached in the same basic manner.

Underfill usually contains a heat curable resin component and a particle filler component. The particle filler component substantially increases the physical strength of the underfill as compared to underfill without filler. The resin component of underfill may have three different physical stages: a-stage (liquid); b-stage (paste/partially cured); and c-stage (hard/fully cured). There are various methods for applying underfill. Sometimes underfill is applied after the solder connections between the die/wafer and substrate have been made. In such cases underfill, in which the resin component is in liquid form (a-stage resin), is applied around the periphery of the substrate and the overlying die/wafer and is carried underneath the die/wafer by wicking or capillary action. The a-stage resin is subsequently changed to b-stage and then c-stage by application of heat and pressure to the die/wafer and the substrate. Tools for applying the heat and pressure are conventional and well known in the art.

Figure 1:
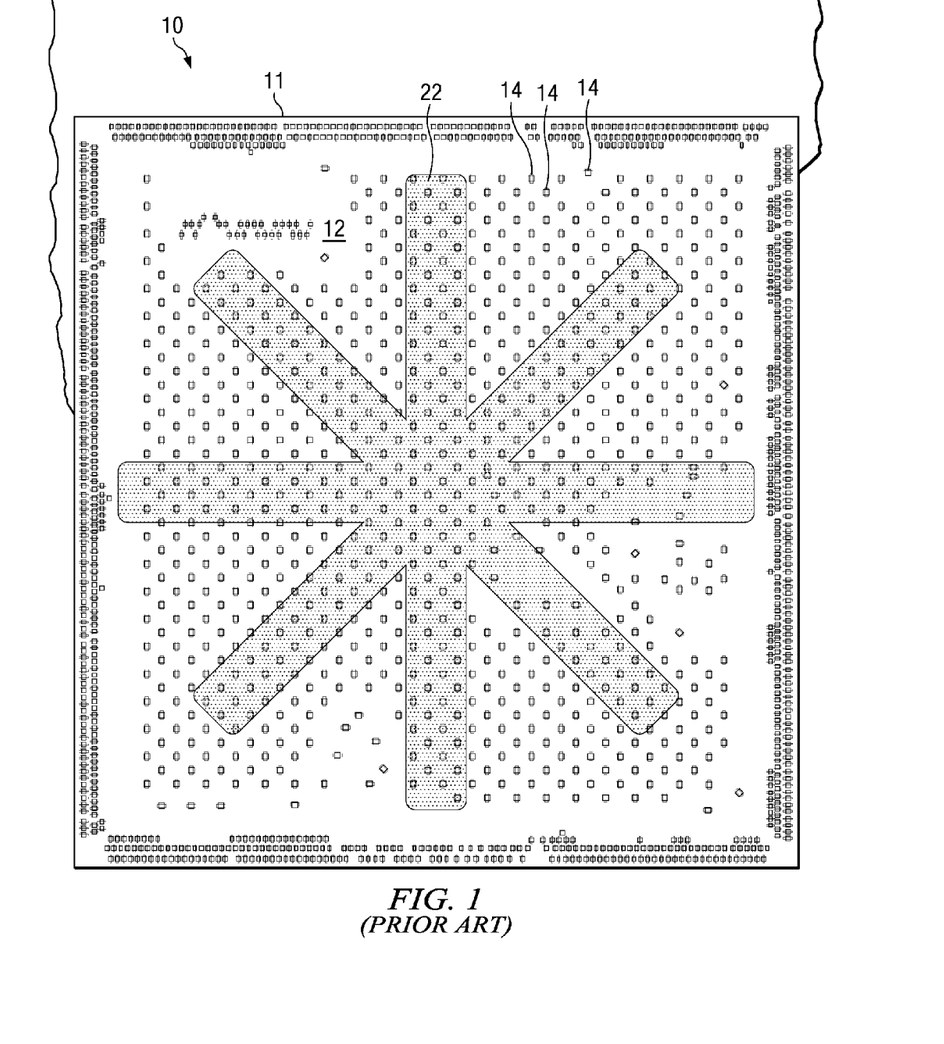
FIG. 1 is a top plan view of a die portion of a wafer having a b-stage resin applied thereto.
Figure 2:
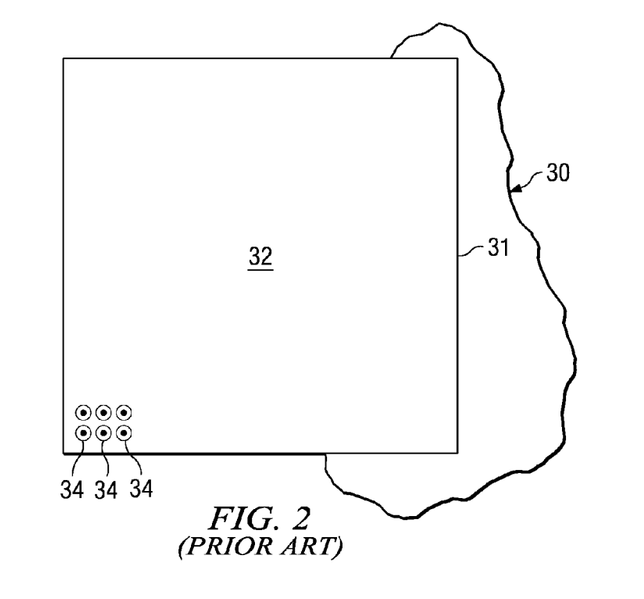
FIG. 2 is a top plan view of a substrate portion to which the die portion of FIG. 1 is to b6
Figure 3:
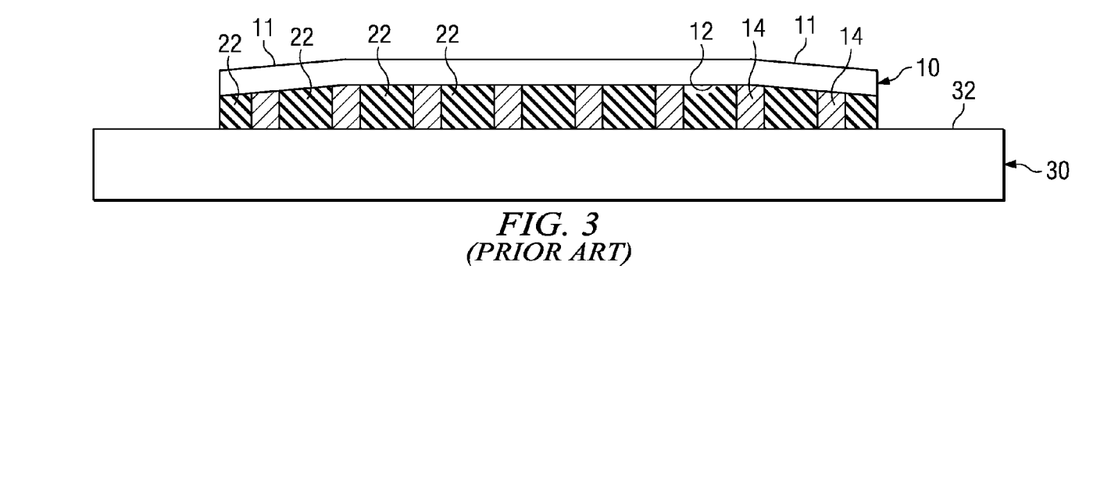
FIG. 3 is a cross sectional side elevation view of the die portion of FIG. 1 attached to the substrate portion of FIG. 2.
Figure 4:
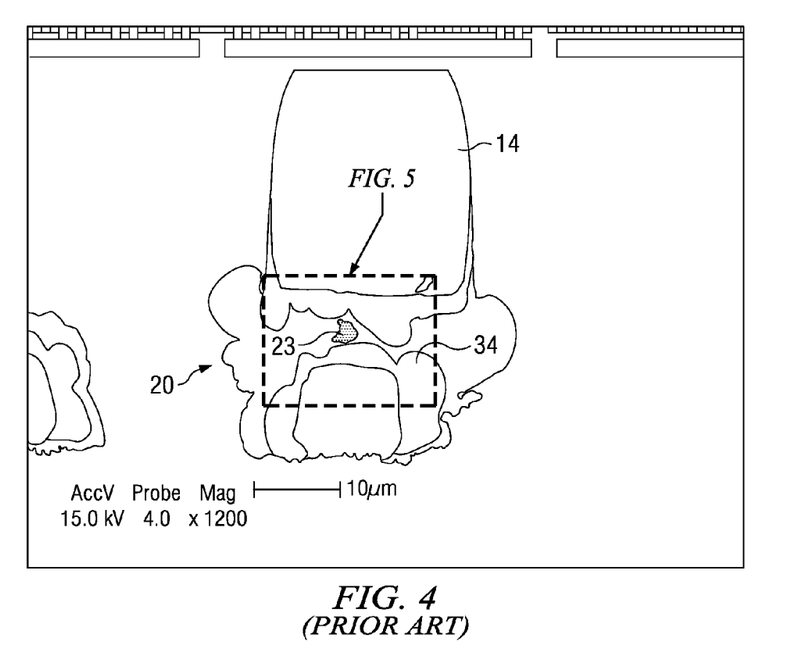
FIG. 4 is a magnified photograph of a CuP on a die soldered to a contact pad on a substrate in which a filler particle is trapped in the solder joint.
Figure 5:
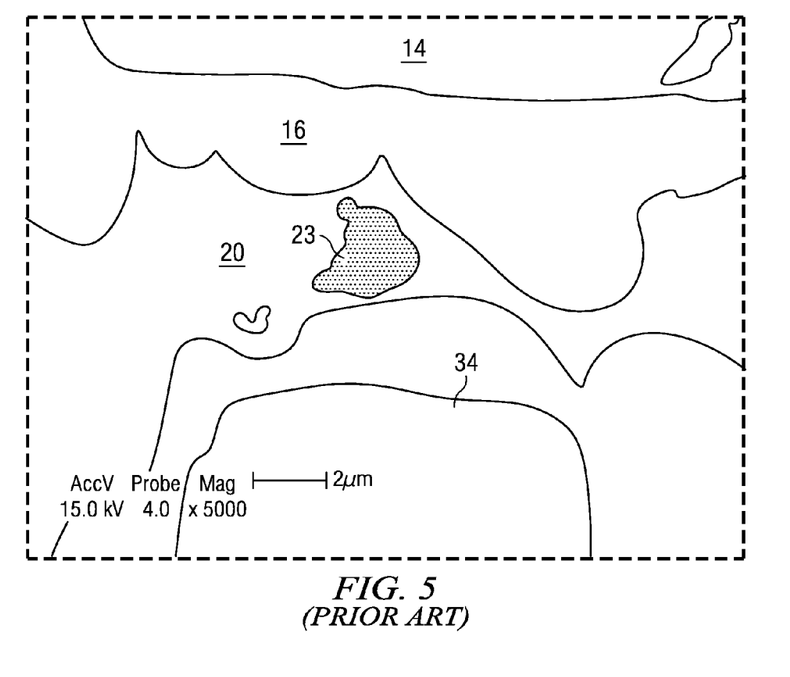
FIG. 5 is the photograph of FIG. 4 at a higher magnification.

As shown by FIGS. 1 and 2, another method of applying underfill is to apply a resin paste (b-stage resin) underfill 22 to a face 12 of each die portion 10 of a wafer 8 from which CuP's 14 project. Alternatively the resin paste underfill 22 may be applied to a face 32 of the portion 31 of a substrate 30 to which the die 10 is to be attached. This paste application is done before soldering the CuP's 14 to the substrate contact pads 34. Using this method the underfill is applied in a generally star shaped pattern near the center of each die portion 10 or each substrate portion 31, and the wafer 8 is then urged against the substrate 30 during application of heat thereto. The heat and pressure may be applied by a conventional tool known in the art. The compression force in one embodiment may be about 70N and the temperature may be about 270° C. The pressure between the wafer 8 and substrate 30 causes the heated underfill to "ooze" around the CuP's 14 to fill in any voids between the wafer 8 and the substrate 30. However, especially with high pitch CuP 14 dies/wafers, the underfill may not flow completely into all voids because of flow interference from the CuP's 14 and because of the increasing viscosity of the underfill 22 as it begins to flow outwardly and cure. Also, the amount of underfill 22 reaching the outer periphery of a die 10 is usually less than the amount nearer the center of the die, causing the die to warp at the edges as bonding pressure is applied, as shown by FIG. 3. Another problem is that particles of filler 23, FIG. 4, are often trapped between the solder piece 16 at the end of a CuP 14 and the associated contact pad 34. As a result of such particle 23 entrapment, the solder joint 20 is weaker than a "clean" joint and has increased resistance to electron flow. The cross section photographs of FIGS. 4 and 5 show, at different levels of magnification, such a solder joint 20 with a trapped filler particle 23. This defect is well recognized in the industry and creating a process that obviates this defect is the subject of world-wide research. This research is concentrated on the difficult task of matching the solder melt point with the underfill flow and underfill curing time and temperature properties. It is believed that the applicant is the first to identify a method to separate the solder melt point from the underfill properties to eliminate the root cause of the defect. In the most often used prior art method of flip chip to package substrate attachment, the dies are mounted one at a time on substrate units with the same footprint as the dies. Prior to die attachment the substrate units are removeably adhesively mounted in a predetermined pattern on an elongate strip. A star-shaped patch of b-stage resin (paste) is applied to the package substrate units, not the chip or wafer. Applying it to the substrate units further complicates the control of the underfill rheology. The package substrate units are positioned in multiple locations on the strip that is fed into the assembly machine. The substrate units located toward the front edge of the strip (the edge leading into the machine) spend less time at the curing temperature than the substrates near the trailing edge of the strip. This variation in time and temperature causes further variation of the process performance. Using the new process disclosed herein, the a-stage material may advance to a greater range of cure and still flow out of the way and have high adhesion because it starts from a lower degree of cure.

Figure 6:
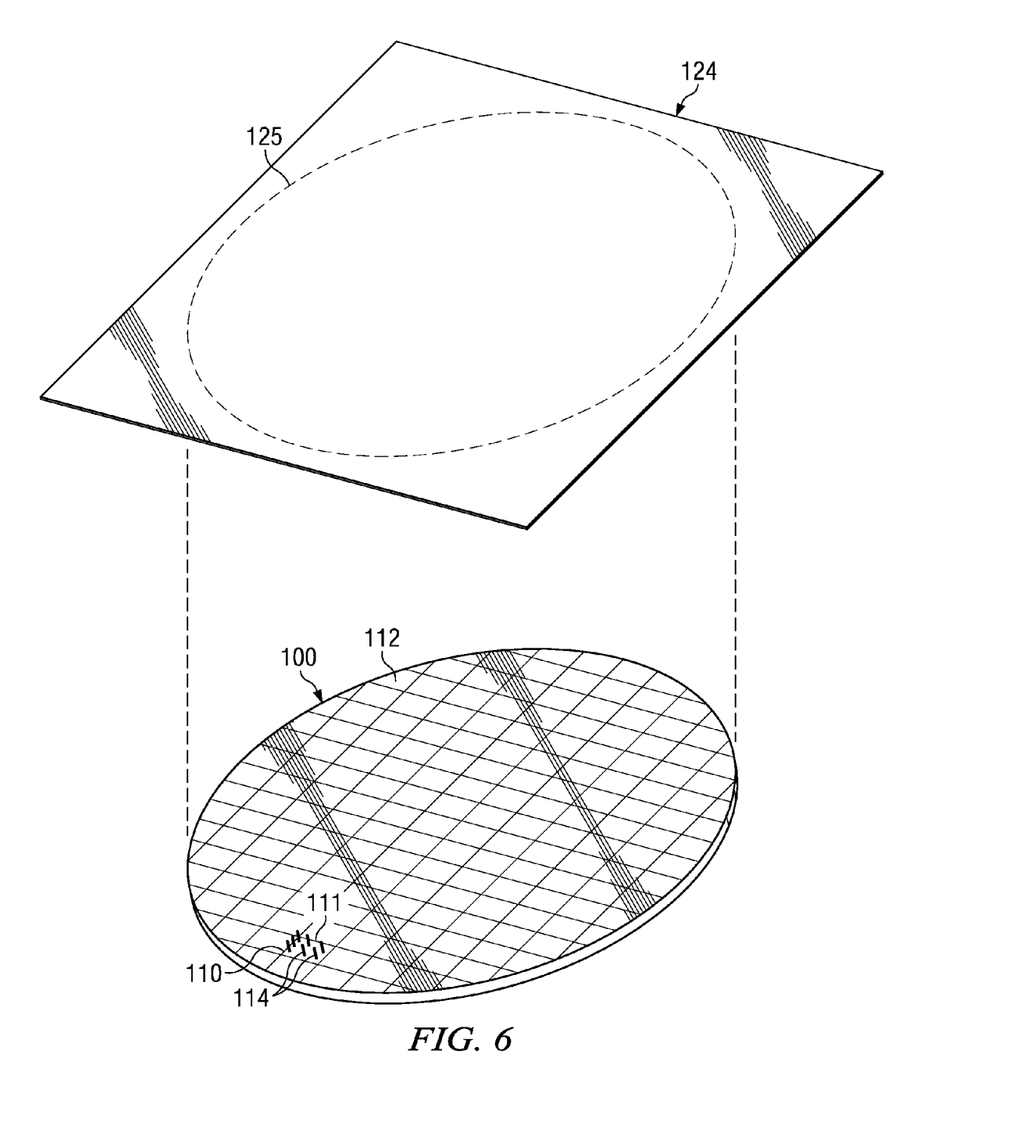
FIG. 6 is an exploded perspective view of a wafer and a cast film strip which is to be applied thereto.

FIG. 6, shows a typical wafer 100 having a plurality of identical, physically connected flip chip die portions 110. Usually, a flip chip wafer 100 is singulated or "diced" into separate dies 110 and then the dies 110 are attached, one at a time, to corresponding small substrate units 131. There are multiple small substrate units 131 arranged on a strip and processed in parallel through the manufacturing operations. However, sometimes the entire wafer 100 is attached to a second wafer 130, which is usually another die wafer, and the first wafer 100 and the second wafer 130 are subsequently diced together into individual flip chip 110 to substrate unit 131 assemblies (usually die-to-die assemblies) such as shown at 170 in FIG. 9. These assemblies 170 are further assembled into various forms of electronic modules. It is to be understood that the die substrate attachment process described herein may be practiced at either the die level or the wafer level. Accordingly, reference to a die 110 and a substrate unit 131 or to a wafer 100 and a substrate 130, as made herein, are to be understood as being generally interchangeable, unless the context clearly demonstrates that another meaning is intended. Similarly, it will be understood that in drawing FIGS. 1, 3, 7 and 8, the components referred to as die portions 110 of a wafer 100 and portions 131 of a substrate 130, when describing operations at the wafer level, would be referred to as individual dies 110 and individual small substrate units 131 when attachment operations are performed at the die level.

Figure 7:
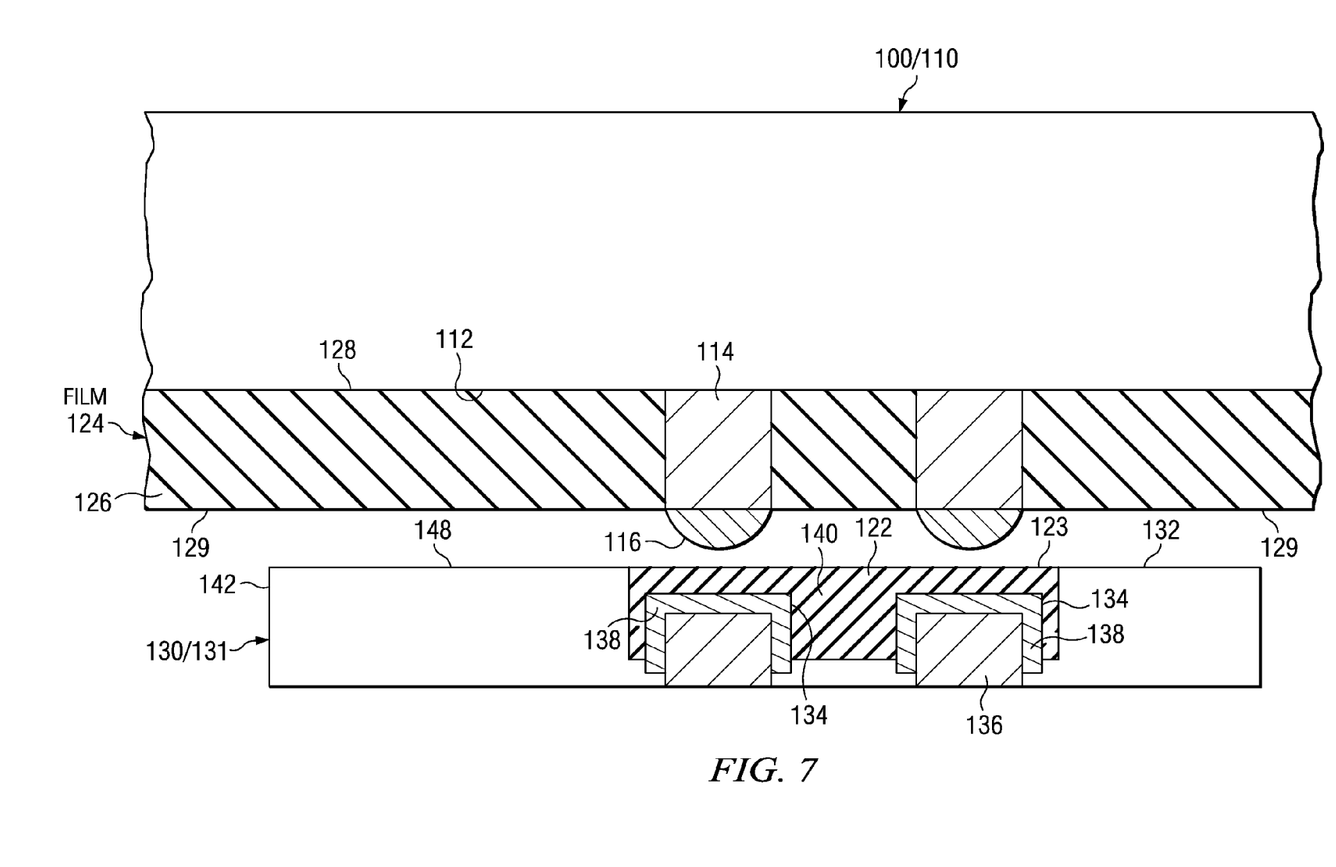
FIG. 7 is a detail, cross sectional side view of a die portion of a wafer immediately before it is attached to a corresponding portion of a substrate.
Figure 8:
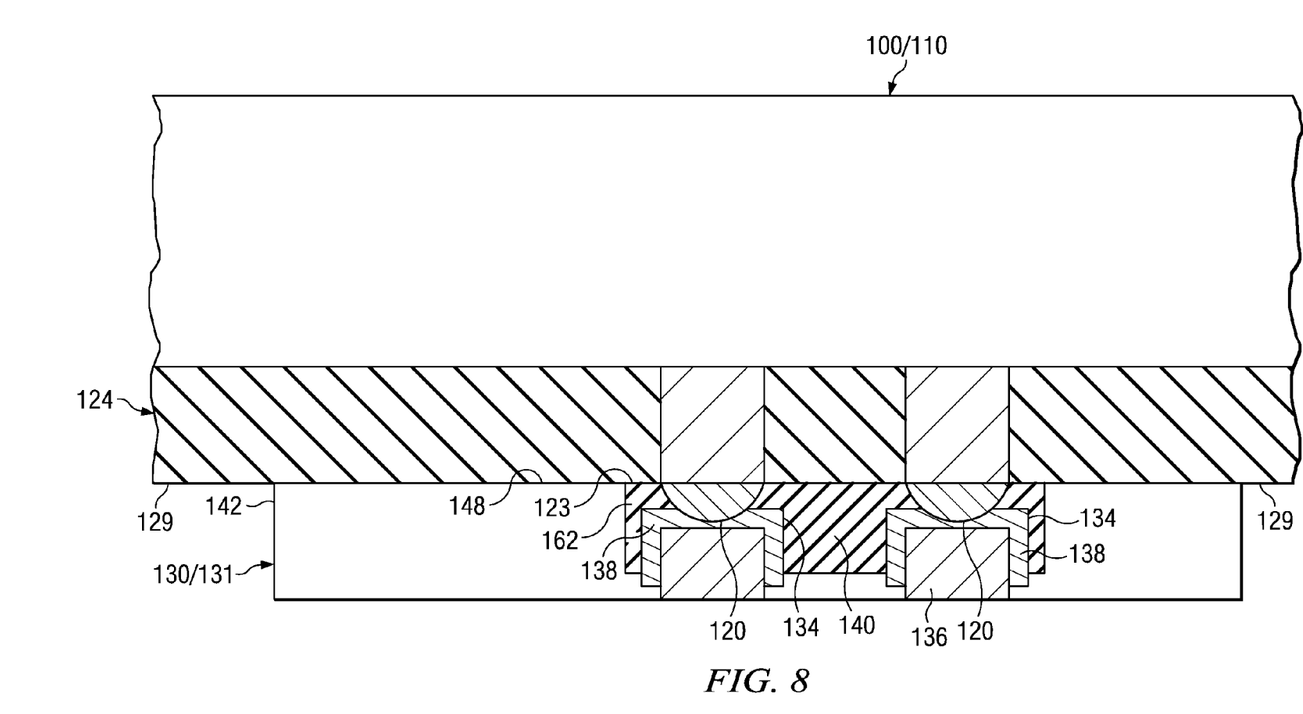
FIG. 8 is a magnified cross sectional side elevation view of the die portion and substrate portion of FIG. 7 after attachment.

The wafer 100 shown in FIG. 6 is shown positioned below a sheet of cast film 124 which may be trimmed as indicated by dashed line 125 and then attached to the first face 112 of the wafer. Alternatively the trimming may take place after attachment of the film 124 to the wafer 100. The terms "first face" or "one face" of the wafer refers to the face 112 from which the CuP's project. Often when those in the art refer to flip chip faces this face 112 is called the "top" face because it is "flipped over" before it is attached to a substrate. However since after it is flipped over this face 112 is positioned facing downward towards the substrate it is sometimes also called the "bottom" face. To avoid confusion the term "first face" or "one face" is used when referring to this face 112 from which the CuP's 114 project. The cast film sheet 124 may be attached to the first face 112 of the wafer 110 by application of heat and pressure thereto for a predetermined period of time depending upon the composition of the film 124. This film 124 may be a b-stage resin that contains a substantial amount of filler material 126. The filler material 126 greatly increases the adhesive strength of the film over the strength it would have without filler. The film 124 is shown in cross section in FIGS. 7 and 8. One example of a film that is suitable for use in this application is Toray LNA2432, 20-30 um thick with 50-70% filler by weight. The meaning of the phrase "substantial amount of filler material," as used herein, will depend to some extent upon the type of resin and the type of filler material used, but generally means an amount of filler material that is more than about 40% by weight of the total weight of the film. As shown by FIGS. 7 and 8, the film 124 may be about the same thickness as the distance between the first face 112 and the point on the CuP 114 where the bullet shaped lead piece 116 is attached. The film 124 may be attached to wafer 110 using a tool with a yielding surface that allows the bullet shaped lead pieces 116 to punch through the film 124 and project from the film outer face 129. The film inner face 128 becomes adhesively attached to die surface 112 as a result of the application of heat and pressure.

The substrate 130/substrate unit 131 has a "first surface" or "one surface" 132 which has contact pads 134 thereon. The contact pads 134, as shown in FIGS. 7 and 8, may each be constructed from an inner copper member 136 having a metal cap 138 thereon which may be made from nickel, gold, or solder of various alloy compositions. Each of the contact pads 134 may be positioned in a well or recess 140 having a base at a distance of about 10 um below a top surface 148 of the substrate. The top surface 148 of the substrate may be on a layer 142 of conventional printed circuit board solder mask. The distance from the bottom of the recess to the top surface 148 in one embodiment may be about 25 um. In the embodiment illustrated in FIGS. 7 and 8, each recess 140 may contain one or more contact pads 134 (two shown). Each of the contact pad recesses 140 are filled with an a-stage resin 122 that contains substantially no filler particles, i.e. the number of filler particles is nominally zero, but some small number of particles, e.g., 2% by weight, would be tolerable although not desirable. The resin 122 may be selected to be a type that bonds with the resin in the film 124 and may be the same type of resin. The resin 122 is also selected to be of a type that bonds with the solder mask material on top surface 148. One way of applying the resin is by screen printing. Another way is by inkjet printing. Both printing techniques are known in the art. The inkjet method may allow for better control of the volume of a-stage resin that is applied.

As shown in FIG. 7 the wafer 100 is positioned such that its CuP's 114 are aligned with contact pads 134 on the substrate. The wafer 100 is urged downwardly so that the bullet shaped solder pieces 112 on each CuP 114 make contact with a contact pad 134 on the substrate, as shown in FIG. 8. The downward movement of the wafer 100 takes place in a heated environment such as a reflow oven wherein the reflow temperature may be, for example, about 260° C. The bullet shaped solder piece as a result of the pressure, e.g. about 60-80N, and heat melts and bonds with the contact pad 134. Since there are nominally no filler particles in the a-stage resin 122 in the contact pad recess 140 the solder joints 120 formed therein are free of particles. Thus a high strength bond is produced. Also, since the resin in the film is selected to be compatible with the a-stage resin 122 and the material on surface 148, it bonds well with both, and the wafer 110 and the substrate 130 are firmly attached. It will be appreciated from the above description that the a-stage resin 122, which is applied as a liquid, fills all of the voids in the surface topography of the substrate 130. Also, since the film 124 is applied as a sheet in a direction normal to the die surface, no radial flow resistance is encountered that would lead to lack of underfill around the periphery of the substrate 110 or voids around the CuP's. Also, the pressure required to bond the CuP's 114 to the package substrate contact pads 134 by penetrating an a-stage resin is lower than in the prior art process where the CuP's 14 were required to penetrate through a thick layer of b-stage resin.

After the soldering of the CuP's 114 to associated contact pads 134 each die/substrate unit undergoes a post bake process, which in one embodiment is a period of about one hour at a temperature of about 150° C. This post bake process converts the b-stage resin in film layer 124 to c-stage resin and converts the a-stage resin 122 in the contact pad recesses 140 to c-stage resin.

Figure 9:
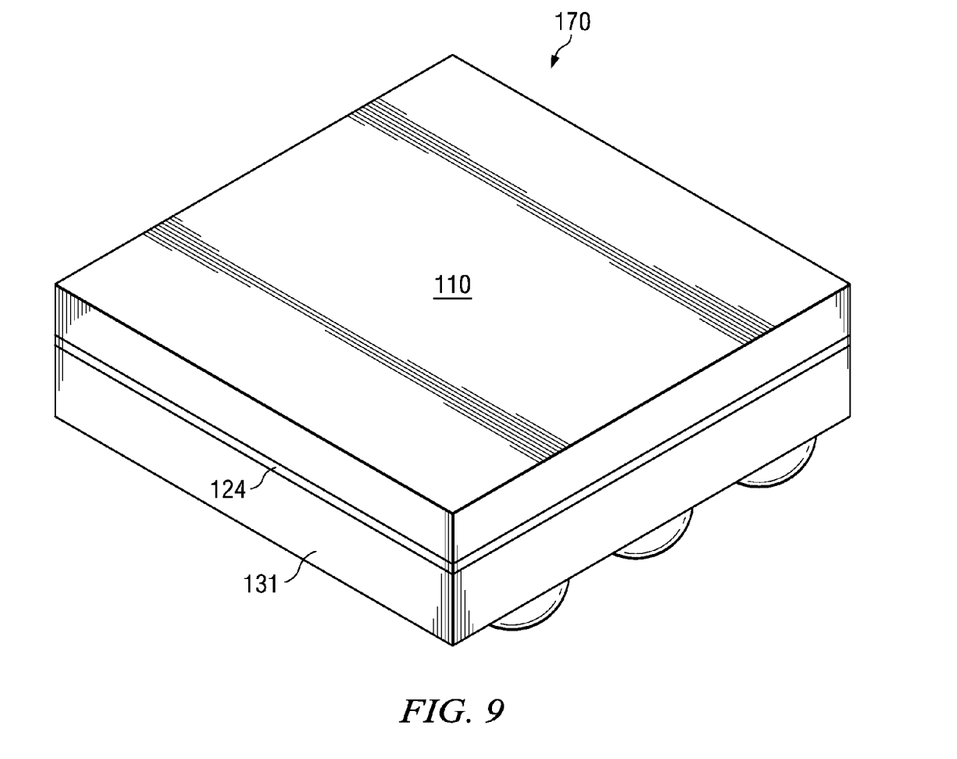
FIG. 9 is a perspective view of a die/substrate assembly after singulation thereof from a wafer/substrate assembly such as shown in FIG. 8.

After attachment of a wafer 100 to a substrate 130 as described above the resulting wafer and attached substrate assembly may be singulated into individual die/substrate unit assemblies 170 such as shown in FIG. 9. When the attachment process is performed on individual die 110 and substrate units 131 the structure of the resulting unit is the same as 170 of FIG. 9. Each such unit 170 has an upper die portion 110 mechanically attached to substrate portion 131 by a a first c-stage resin layer (formerly film layer 124) and a second c-stage resin layer 162 (formerly a-stage resin layer 122), FIG. 8, as well as by the solder joints 120 formed between CuP's 114 and contact pads 134. It will be understood that FIG. 8 has been used herein to describe the structure of a die/substrate unit both at the time the CuP's 114 of the die/die portion 100/110 first come into contact with the contact pads 134 of the substrate/substrate portion 130/131 and also after the soldering process and post bake curing process has been completed and both resin layers 122, 124 have been converted to c-stage resin layers.

As previously noted the attachment process described herein may be performed at the wafer level or the die (diced wafer) level or partially at the wafer level and partially at the die level. Thus it is to be understood that the term "die 110" as used in this Description and in the claims refers to both a pre-dicing die portion of a wafer 100 as well as a die unit that has been singulated from a die wafer 100. Similarly the term substrate is used herein to refer to a large substrate or "substrate wafer" 130 from which individual substrate units may be singulated as well as individual units having the same footprint as a die 110.

While certain specific embodiments of a method for attaching a die to a substrate and apparatus formed by the method have been disclosed herein, multiple variations on these described embodiments can also be made and used as will be obvious to those skilled in the art after reading this disclosure. It is intended that the language of the attached claims be broadly construed to cover such variations, except to the extent limited by the prior art.

What is claimed is:

1. An electrical device comprising:
    a substrate having a first face comprising a plurality of wells or recesses, wherein each well or recess contains at least one contact pad;
    a die having a first face;
    a plurality of copper pillers CuP's extending from said first face of said die, each CuP having a distal end and a solder tip mounted on said CuP distal end, each said solder tip having a distal end;
    a first c-stage resin layer having a relatively larger amount of filler particles therein, said first c-stage resin layer having a first surface adhered to said first face of said die and having a second surface opposite said first surface thereof; and
    a second c-stage resin layer having a relatively smaller amount, if any, of filler particles therein, said second c-stage resin layer having a first surface adhered to said substrate first face and having a second surface opposite said first surface that is adhered to said second surface of said first c-stage resin layer;
    wherein, said plurality of contact pads are comprised of:
    an inner copper member;
    a metal cap covering the inner copper member, composed of a material selected from the group of nickel, gold, solder or various alloys thereof;
    wherein the tops of each of the plurality of the contact pads are be positioned in the well or recess having a base at a distance of about 10 um below a top surface of the substrate.

2. The electrical device of claim 1 said solder tip of each of said plurality of CuP's being soldered to an associated one of said contact pads.

3. The electrical device of claim 1, wherein the top surface of the substrate is a layer of conventional printed circuit board solder mask.

4. The electrical device of claim 2, each of said solder tips soldered to an associated contact pad being encapsulated by said second c-stage resin layer.

5. The electrical device of claim 1 wherein said first c-stage resin layer has a resin component and wherein said second c-stage resin layer has a resin component and wherein said resin component of said first c-stage resin layer and said resin component of said second c-stage resin layer have the same composition.

6. The electrical device of claim 1 wherein said first c-stage resin layer has a filler particle component of between about 30% and about 70% by weight and wherein said second c-stage resin layer has a filler particle component of about 0% by weight.

7. A flip chip assembly comprising:
- a substrate having a first face comprising a plurality of wells or recesses, wherein each well or recess contains at least one contact pads;
- a die having a first face;
- a plurality of copper pillers CuP's extending from said first face of said die, each CuP having a distal end and a solder tip mounted on said CuP distal end, said solder tip having a distal end;
- a first c-stage resin layer having a relatively large amount of filler particles therein, said first c-stage resin layer having a first surface adhered to said first face of said die and having a second surface opposite said first surface thereof;
- a second c-stage resin layer having a relatively smaller amount, if any, of filler particles therein, said second c-stage resin layer having a first surface adhered to said substrate first face surface and having a second surface opposite said first surface that is adhered to said second surface of said first c-stage resin layer;
- said solder tip of each of said plurality of CuP's being soldered to an associated one of said contact pads;
- each of said solder tips soldered to an associated contact pad being encapsulated by said second c-stage resin layer;
- said first c-stage resin layer having a resin component and wherein said second c-stage resin layer has a resin component that is the same composition as said resin component of said first c-stage resin layer; and
- said first c-stage resin layer having filler particles of between about 30% and about 70% by weight and wherein said second c-stage resin layer has filler particles of between about 0% and 2% by weight.

8. The electrical device of claim 7, said plurality of contact pads comprising:
- an inner copper member;
- a metal cap covering the inner copper member, composed of a material selected from the group of nickel, gold, solder or various alloys thereof;
- wherein the tops of each of the plurality of the contact pads are positioned in the well or recess having a base at a distance of about 10 um below a top surface of the substrate.

9. The electrical device of claim 7, wherein the top surface of the substrate is a layer of conventional printed circuit board solder mask.

* * * * *